United States Patent
Gostein et al.

(10) Patent No.: US 9,413,174 B2
(45) Date of Patent: Aug. 9, 2016

(54) I-V MEASUREMENT SYSTEM FOR PHOTOVOLTAIC MODULES

(75) Inventors: Michael Gostein, Austin, TX (US);
Russell Apfel, Austin, TX (US);
Lawrence R. Dunn, Austin, TX (US);
Stan Faullin, Round Rock, TX (US);
Naoum Gitnik, Austin, TX (US); Jason Schneider, Austin, TX (US)

(73) Assignee: Atonometrics, Inc., Austin, TX (US)

( * ) Notice: Subject to any disclaimer, the term of this patent is extended or adjusted under 35 U.S.C. 154(b) by 1107 days.

(21) Appl. No.: 13/511,087

(22) PCT Filed: Nov. 30, 2010

(86) PCT No.: PCT/US2010/058382
§ 371 (c)(1),
(2), (4) Date: Nov. 15, 2012

(87) PCT Pub. No.: WO2011/066554
PCT Pub. Date: Jun. 3, 2011

(65) Prior Publication Data
US 2013/0181736 A1    Jul. 18, 2013

Related U.S. Application Data

(60) Provisional application No. 61/265,013, filed on Nov. 30, 2009.

(51) Int. Cl.
*H02J 3/38*    (2006.01)
*H02S 50/10*   (2014.01)
(Continued)

(52) U.S. Cl.
CPC ............... *H02J 3/383* (2013.01); *H02S 50/10* (2014.12); *G01R 31/2635* (2013.01); *G05F 1/67* (2013.01)

(58) Field of Classification Search
CPC .......... H02J 3/383; H02J 3/385; H02J 3/382; G01R 31/405; G01R 31/2604; G01R 31/2605; G01R 31/2635; G05F 1/67
See application file for complete search history.

(56) References Cited

U.S. PATENT DOCUMENTS 4,528,503 A    7/1985  Cole
6,111,767 A    8/2000  Handleman
(Continued)

OTHER PUBLICATIONS

King, D.L., Hansen, B.R., Kratochivl, J.R., and Quintanra, M.A.; Dark Current-Voltage Measurements on Photovoltaic Specialists Conference, Sep. 1997. [retrieved on May 6, 2011]. Retrieved from the internet: http://ieeexplore.ieee.org/xpl/freeabs_all.jsp?arnumber=654286. Abstract.

*Primary Examiner* — Jermele M Hollington
*Assistant Examiner* — Dustin Dickinson

(57) ABSTRACT

An apparatus for measuring electrical characteristics of solar panels (photovoltaic modules) wherein the apparatus measures current versus voltage ("I-V") relationships for both illuminated ("light I-V") and/or non-illuminated ("dark I-V") conditions; optionally provides single, dual, or four-quadrant source/sink capability; and measures one or more devices under test (DUTs). The apparatus comprises one or more source measurement units (SMUs), wherein each SMU is connected to one DUT, and optionally includes a positive high-voltage programmable power supply and/or a negative high-voltage programmable power supply. Additionally, the apparatus includes a controller which controls the functions of the SMUs, the high-voltage supplies, and other components of the apparatus, wherein the controller communicates with the SMUs over a signal bus. Finally, the apparatus may include a computer to provide a user interface, communicate with the controller to initiate measurements and record results, analyze resulting data to determine measured parameters, and/or store the measured data.

34 Claims, 12 Drawing Sheets

(51) Int. Cl.
*G05F 1/67* (2006.01)
*G01R 31/26* (2014.01)

(56) References Cited

U.S. PATENT DOCUMENTS

| | | | |
|---|---|---|---|
| 7,288,825 B2 * | 10/2007 | Rafferty | H01L 27/14649 257/432 |
| 8,228,088 B1 * | 7/2012 | Hinze | H02S 50/10 324/761.01 |
| 2005/0172995 A1 * | 8/2005 | Rohrig | H01L 31/02021 136/243 |
| 2009/0133735 A1 | 5/2009 | Yuguchi | |
| 2009/0284998 A1 * | 11/2009 | Zhang | G05F 1/67 363/55 |
| 2010/0085670 A1 | 4/2010 | Palaniswami | |
| 2010/0275982 A1 * | 11/2010 | Abbott | H01L 31/0352 136/255 |

* cited by examiner

I-V MEASUREMENT SYSTEM FOR PHOTOVOLTAIC MODULES

RELATED APPLICATION DATA

The present application claims priority to U.S. Provisional Patent Application Ser. No. 61/265,013, entitled "I-V MEASUREMENT SYSTEM FOR PHOTOVOLTAIC MODULES", and filed Nov. 30, 2009, which is incorporated herein by reference.

FIELD OF THE INVENTION

The invention relates to an apparatus for measuring electrical characteristics of solar panels, also known as photovoltaic ("PV") modules. Specifically, the apparatus measures current versus voltage relationships, also known as "I-V" curves.

BACKGROUND OF THE INVENTION

Photovoltaic ("PV") devices are used in solar energy systems for converting sunlight to electricity. The basic unit of a PV device is the PV cell, which produces an electrical output when illuminated. PV modules contain multiple PV cells electrically connected in series and/or parallel combinations to yield a desired output voltage and current, and are packaged in a suitable form for outdoor use. PV modules, also known as "solar panels," typically form the basic unit of a solar energy generation system.

One of the fundamental characterization tests of a PV device is the measurement of its current versus voltage relationship, or "I-V" curve. FIG. 1 depicts exemplary I-V curves for a PV device, including curves under both illuminated and non-illuminated conditions (respectively, "light I-V" and "dark I-V").

FIG. 1 depicts a graph with a voltage axis 100 and a current axis 102, representing voltage and current at the terminals of a PV device during measurement of an I-V curve. In FIG. 1 the polarity of the current axis 102 is defined as positive when positive current flows from the positive terminal of a testing system to the positive terminal of the PV device under test ("DUT"). With this definition, photocurrent is negative. The graph is conventionally divided into quadrants (104, 105, 106, 107) according to the polarity of voltage and current.

A light I-V curve 110 is measured when the PV device is illuminated and produces a photocurrent. In the power quadrant 104 the PV device sources power, which must be dissipated by the testing system. Isc (112) is the current at short-circuit (voltage V=0) and Voc (116) is the voltage at open-circuit (current I=0). The maximum power point ("MPP") 114 occurs at a point where the power curve—the product of voltage and current, not shown—reaches a maximum. The light I-V curve 110 and the associated maximum power will be a function of the illumination intensity as well as the parameters of the PV device.

I-V measurements of illuminated devices in the power quadrant 104 comprise the majority of PV device testing. For these measurements, the testing system only sinks power provided by the DUT and does not need to supply power. However, valuable information can also be obtained from measurements in the other I-V quadrants, where the testing system must source power, including measurement of the light I-V curve 110 in the reverse-bias quadrant 105 and measurement of the dark I-V curve 120. These data can be used to determine various device parameters including shunt resistance, series resistance, diode saturation current, diode ideality factors, and other parameters. Therefore, it is often desirable to characterize PV devices using four-quadrant measurement systems, i.e. systems with the capability to both source and sink power. See, for example, D. L. King et al, "Dark Current-Voltage Measurements on Photovoltaic Modules as a Diagnostic or Manufacturing Tool," IEEE PVSC, 1997, which is incorporated herein by reference. For dark I-V measurements, it is desirable to measure at voltages and currents up to ~1.5-2× Voc or Isc, respectively, while also providing accurate current measurements all the way down to the microamp range, to allow proper analysis of data at low voltages).

For a PV cell, Voc is typically <1 V, and Isc is typically in the range of 1-10 A, depending on cell technology, size, and illumination intensity. PV modules contain many PV cells connected in series combinations, and therefore produce significantly higher voltages. For example, typical ~250 W PV modules using silicon-based PV cells have Voc of 20-50 V and Isc of 5-10 A, while typical 50-150 W thin film PV modules using amorphous silicon, CdTe, or CIGS cells have Voc 50-150 V and Isc ~1.0-2.5 A, although other ranges are also possible.

In addition to measuring the I-V curve of a PV device, it is often desirable to use an I-V testing system to maintain a PV device at a specific point along its I-V curve for an extended period. For example, a device may be held at Isc, MPP, Voc, or other points along the I-V curve during extended illumination (also known as "light soaking"). For such tests, the I-V measurement system operates in a continuous mode, rather than in a pulsed or transient mode.

Exemplary instruments providing four-quadrant I-V testing of PV cells and small modules include, for example, the Series 2400 SourceMeter® (a registered trademark of Keithly Instruments, Inc.) and related products, manufactured by Keithly Instruments, Inc. These instruments provide four-quadrant transient and continuous I-V measurement capability, but only over limited parameter ranges that exclude high-current cells and most typical PV modules. Multiple instruments may be used in series and/or parallel combinations to access higher current or voltage ranges. However, this approach is not economical, particularly when extended to measurement of many PV modules.

Other exemplary instruments include DC electronic load systems, available from a number of manufacturers, which are available over wide ranges of current and voltages suitable for PV modules. However, such systems measure only in the power quadrant 104. The units may be extended into the reverse-bias quadrant 105 by combination with a biasing power supply. However, this adds only limited additional functionality.

Another approach is to combine a bipolar (source/sink) power supply with a high-precision digital multimeter providing current and voltage measurement. However, such power supplies are typically constructed to provide any output current at any voltage, within the respective current and voltage ranges of the instrument, which leads to higher cost than required for the PV module testing application.

Typical existing commercial I-V measurement systems for PV devices have some or all of the shortcomings discussed above; therefore, there is a need for an improved I-V measurement system for PV modules.

BRIEF SUMMARY OF THE INVENTION

The disclosed subject matter provides an apparatus for performing I-V measurements of photovoltaic modules with one or more of the following features: ability to measure at currents of 10 A or greater; ability to measure at voltages of 100 V or greater; ability to measure with current and voltage combinations permitting measurement of modules with output power of 250 W or greater; ability to measure in multiple I-V quadrants, including measurement of dark I-V curves 120; ability to measure currents from the amp to the microamp range; and ability to continuously maintain the PV module at any point along an I-V curve, sourcing or sinking power as required.

It is an object of the disclosed subject matter to provide an apparatus which may be configured to provide I-V measurements for a wide range of PV modules, including modules using both crystalline silicon and thin film technologies.

It is another object of the disclosed subject matter to provide an apparatus which provides for both transient and continuous measurements.

Yet another object of the disclosed subject matter is to provide an apparatus which is economically scalable to measurements of multiple PV modules, e.g. in a manufacturing environment.

Still another object of the disclosed subject matter is to provide an apparatus which may be optionally configured to provide for single-quadrant, dual-quadrant, or four-quadrant I-V measurement capability, including measurement of light I-V curves 110 and dark I-V curves 120.

FIG. 2 depicts a block diagram of an embodiment of the disclosed subject matter. This embodiment comprises a measurement unit 210, wherein the measurement unit 210 further comprises one or more measurement channels, each of which includes a source measurement unit ("SMU") 240, wherein each SMU 240 is connected to one PV module device under test ("DUT") 250 via connections 245. The measurement unit 210 may further comprise a negative high-voltage power supply ("HVPS-") 230 and/or a positive high-voltage power supply ("HVPS+") 235. The measurement unit 210 further comprises a controller 220 which controls the functions of the SMUs 240, the high-voltage supplies (230, 235), and other components of the apparatus, wherein the controller 220 communicates with the SMUs 240 over a signal bus 225. The measurement unit 210 is coupled to a computer 200, which provides a user interface, communicates with the controller 220 to initiate measurements and record results, analyzes resulting data to determine measured parameters, and stores resulting data.

Each SMU 240 can fix its output at a variable voltage (or, in an alternative embodiment, a variable current), while accurately measuring the resulting voltage and current. The SMUs 240 operate between a common positive voltage rail, which is connected to HVPS+ 235, if present, and a common negative voltage rail, which is connected to HVPS- 230, if present, and otherwise is connected to a common floating ground point via a bypass diode (not shown in FIG. 2). When an SMU 240 is sinking power from a DUT 250, this power is dissipated internally within the SMU 240. When HVPS+ 235 and/or HVPS- 230 are present, the SMU 240 output voltage can extend outside the power quadrant 104 and the SMU sources power to the DUT 250. Preferably, the connections 245 between the SMUs 240 and DUTs 250 are four-wire connections for accurate voltage measurement; however, other connections could be utilized.

To measure an I-V curve of a DUT 250 connected to an SMU 240, the controller 220 sets the variable output voltage of the SMU 240 to an initial value and then steps this value progressively up or down to a final value, while recording the current and voltage measured by the SMU 240 at each step. During this process, the controller 200 may also adjust the output voltages of the HVPS+/- supplies (235, 230) so as to minimize internal power dissipation within the SMU 240.

I-V data recorded by the controller 220 may be uploaded to the computer 200, which may analyze the data and/or store the data in a database.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of the accompanying claims.

BRIEF DESCRIPTIONS OF THE DRAWINGS

The novel features believed characteristic of the disclosed subject matter will be set forth in the claims. The disclosed subject matter itself, however, as well as a preferred mode of use, further objectives, and advantages thereof, will best be understood by reference to the following detailed description of illustrative embodiments when read in conjunction with the accompanying drawings, wherein:

Figure 7:
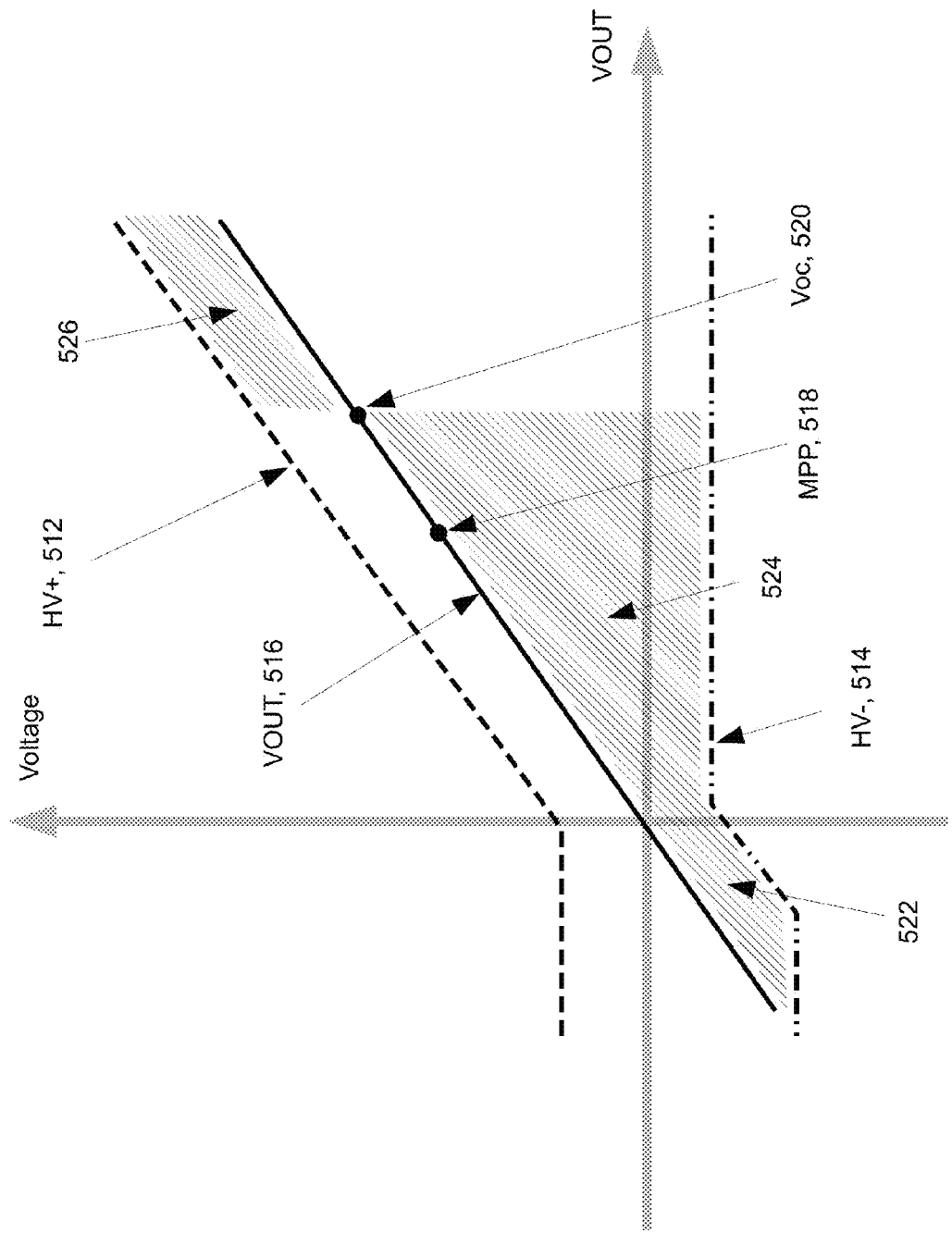

FIG. 7 depicts an exemplary programmed relationship between the output voltage of the high-voltage amplifier of an SMU and the voltages of positive and negative high-voltage power supplies HVPS+ and HVPS-, respectively, in an I-V measurement system according to one embodiment of the disclosed subject matter, and further depicts internal voltage drops within the SMU when the system is measuring dark I-V.

Figure 8:
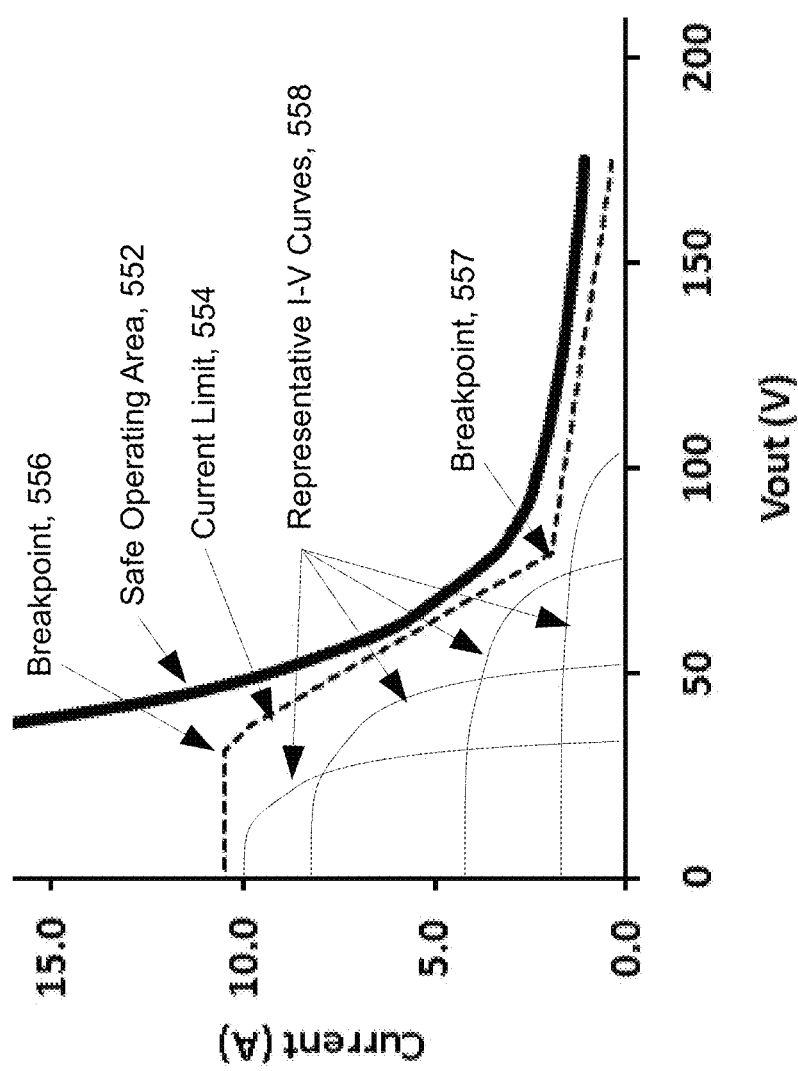

FIG. 8 depicts programmed voltage relationships and internal voltage drops similar to those of FIG. 7, when the system is measuring light I-V.

Figure 9:
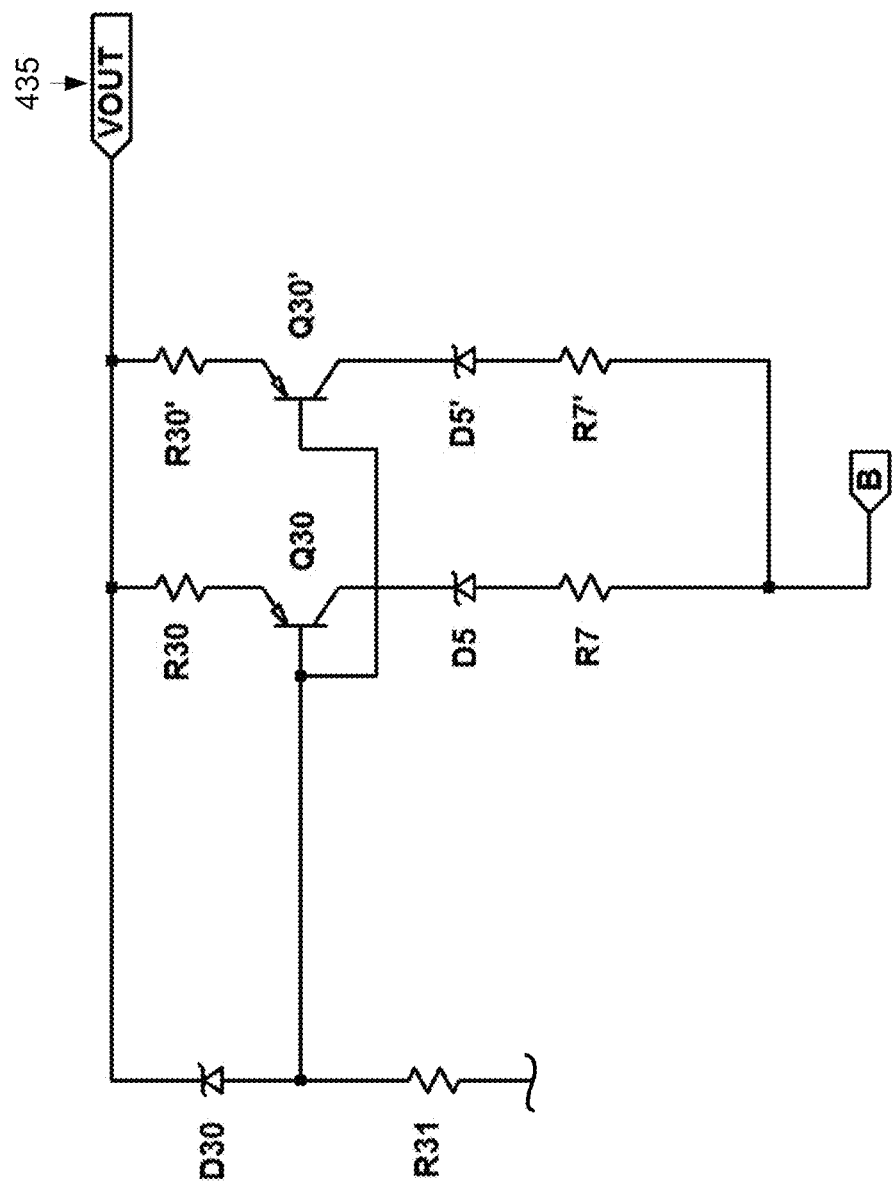

FIG. 9 depicts the safe operating area of transistor devices in the current-sinking portion of a high voltage amplifier, together with an exemplary current limit function and I-V curves of exemplary PV modules, in an I-V measurement system according to one embodiment of the disclosed subject matter.

Figure 4:
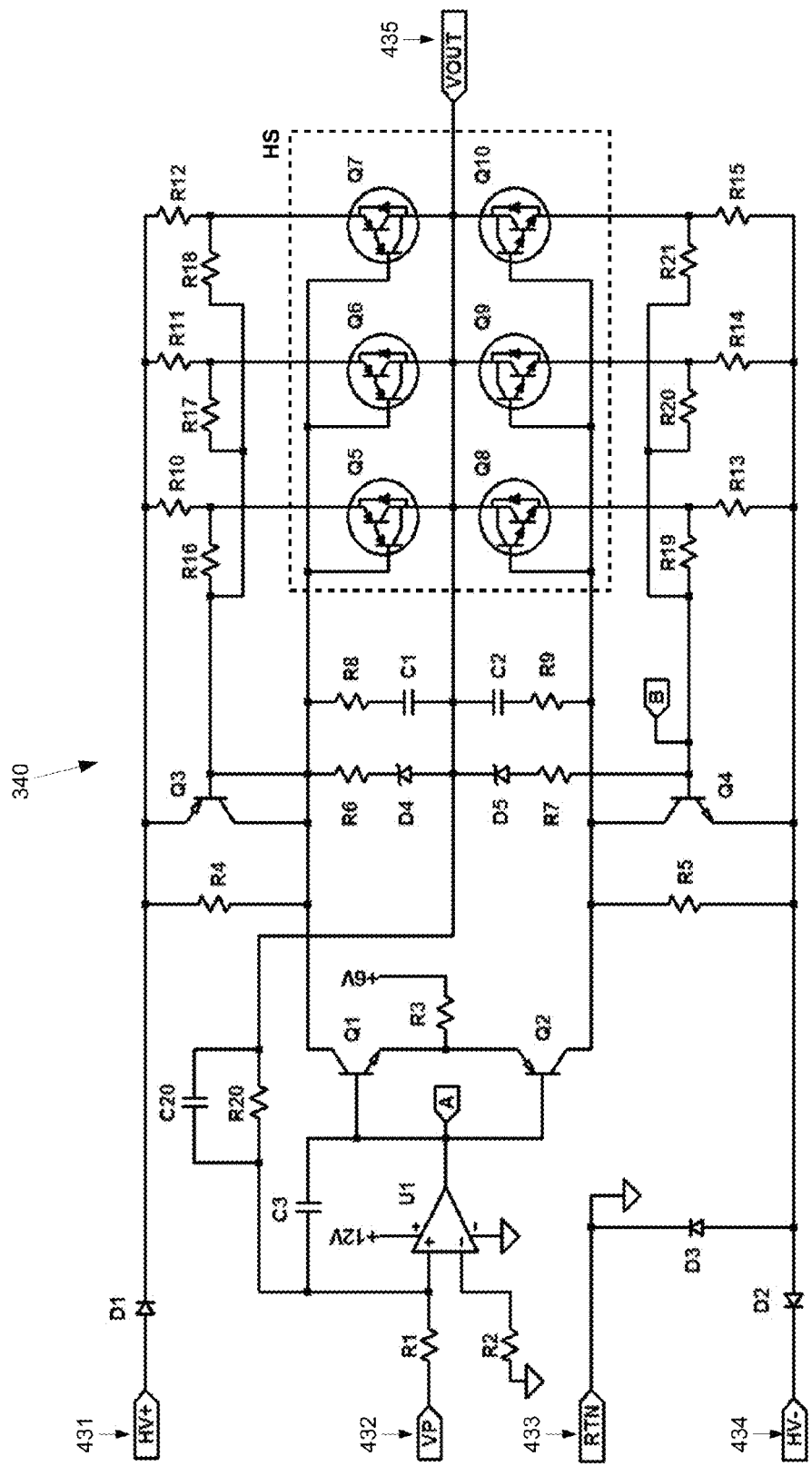
FIG. 4 depicts one embodiment of a high-voltage amplifier portion of an SMU according to the disclosed subject matter.
Figure 10:
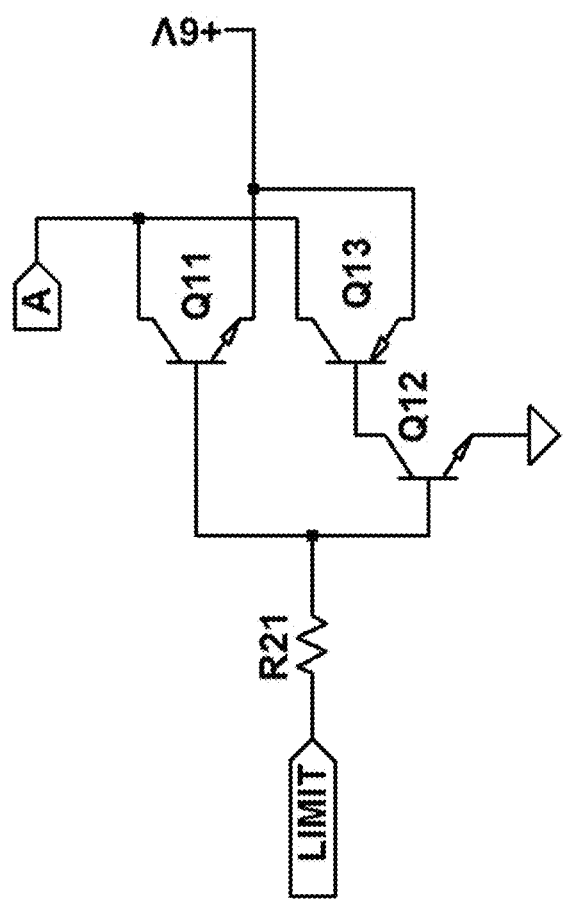

FIG. 10 depicts an exemplary circuit for achieving multiple breakpoints in the current limit function of the high-voltage amplifier depicted in FIG. 4.

Figure 11:
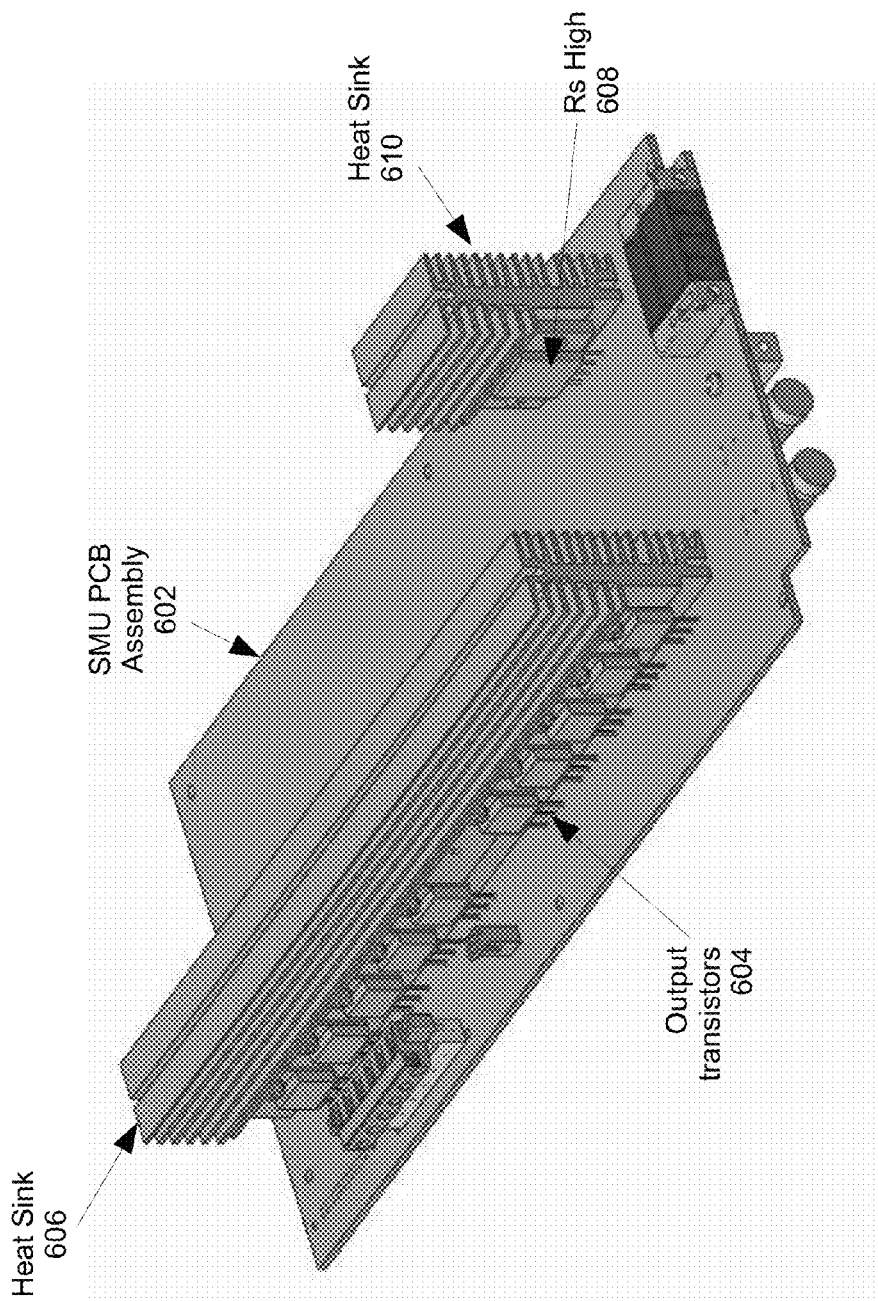

FIG. 11 depicts one embodiment of a source measurement unit (SMU) printed circuit board assembly according to one embodiment of the disclosed subject matter.

Figure 12:
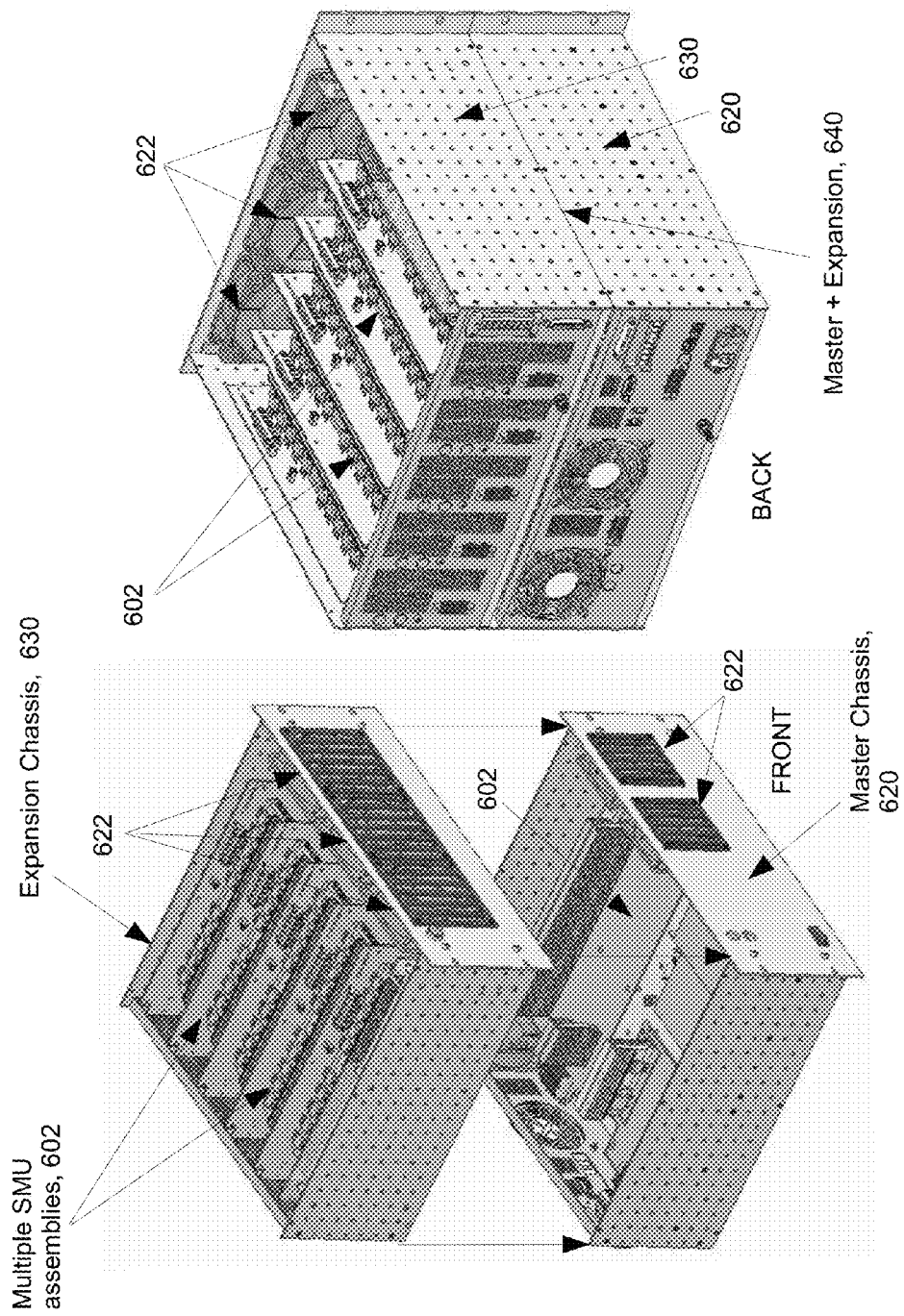

FIG. 12 depicts an exemplary embodiment of a multi-channel I-V measurement system according to the disclosed subject matter, including a base single-channel system and a five-channel expansion chassis which mounts to the base system.

In the figures, like elements should be understood to represent like elements, even though reference labels are omitted on some instances of a repeated element, for simplicity.

DETAILED DESCRIPTION OF ILLUSTRATIVE EMBODIMENTS

Although described with particular reference to an I-V measurement system for photovoltaic modules, those with skill in the arts will recognize that the disclosed embodiments have relevance to a wide variety of areas in addition to those specific examples described below.

All references, including publications, patent applications, and patents, cited herein are hereby incorporated by reference to the same extent as if each reference were individually and specifically indicated to be incorporated by reference and were set forth in its entirety herein.

Overview

Figure 2:
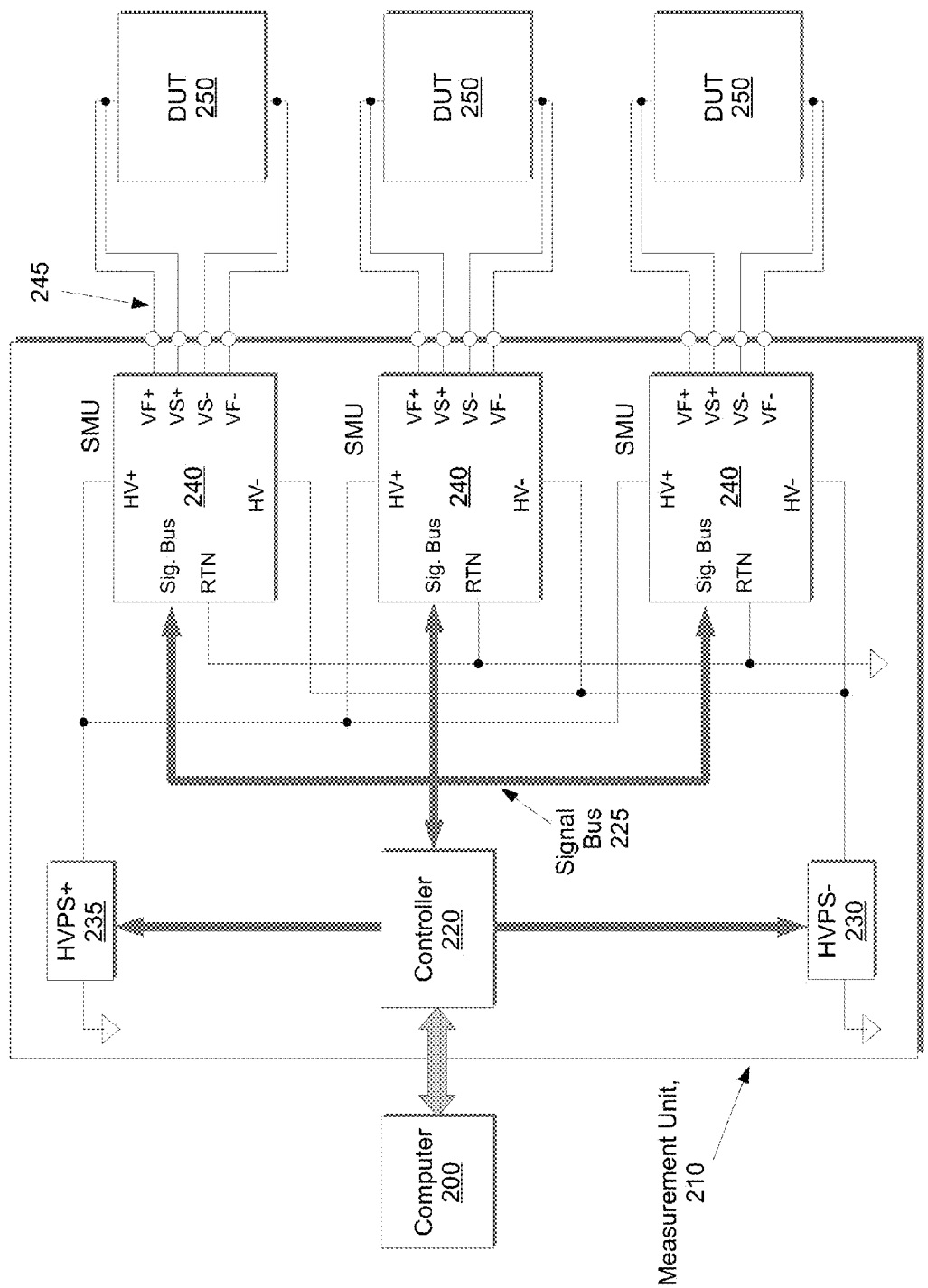
FIG. 2 depicts a block diagram of an I-V measurement system according to one embodiment of the disclosed subject matter.

FIG. 2 depicts a block diagram of one embodiment of the disclosed subject matter. The apparatus comprises a measurement unit 210, wherein the measurement unit 210 further comprises one or more measurement channels, each of which includes a source measurement unit ("SMU") 240, wherein each SMU 240 is connected to one PV module device under test ("DUT") 250 via connections 245. The measurement unit 210 may further comprise a negative high-voltage power supply ("HVPS−") 230 and/or a positive high-voltage power supply ("HVPS+") 235. The measurement unit 210 further comprises a controller 220 which controls the functions of the SMUs 240, the high-voltage supplies (230, 235), if present, and other components of the apparatus, wherein the controller 220 communicates with the SMUs 240 over a signal bus 225. The measurement unit 210 may be coupled to a computer 200, which may provide a user interface, communicate with the controller 220 to initiate measurements and/or record results, analyze resulting data to determine measured parameters, store calibration and/or configuration data, and/or store resulting data.

The measurement unit 210 may further comprise low-voltage power supplies (not shown) for powering the controller 220 and SMUs 240, and cooling fans (not shown) for exhausting heat produced by internal power dissipation.

In one embodiment, the controller 220 includes a microcontroller. In another embodiment, the controller 220 includes non-volatile memory which is used to store program information and/or calibration information.

The signal bus 225 may include analog and/or digital communication. Digital communication is implemented using any of a number of standard communication protocols, including chip-to-chip protocols such as, for example, SPI (Serial Peripheral Interface) or I2C (Inter-Integrated Circuit). Although specific examples are provided, other standard or proprietary communication systems may be employed.

Each SMU 240 can fix its output at a variable voltage (or, in an alternative embodiment, a variable current), while accurately measuring the resulting voltage and current provided at the DUT 250 associated with that SMU 240. The SMUs 240 operate between a common positive voltage rail ("HV+"), which is connected to HVPS+ 235, if present, and a common negative voltage rail ("HV−"), which is connected to HVPS− 230, if present, and otherwise is connected to a common floating ground point via a bypass diode (not shown in FIG. 2). When an SMU 240 is sinking power from a DUT 250, this power is dissipated internally within the SMU 240. When HVPS+ 235 and/or HVPS− 230 are present, the SMU 240 output voltage and current can extend outside the power quadrant 104 and the SMU sources power to the DUT 250. Preferably, the connections 245 between the SMUs 240 and DUTs 250 are four-wire connections (although alternate connections may be employed) for accurate measurement of the remote voltage at the DUTs 250, wherein VF+/− (362, 368) designate the "force" terminals and VS+/− (364, 366) designate the "sense" terminals.

Although depicted with three SMUs 240, any number of SMUs 240, subject to the practical limitations of the controller 220, signal bus 225, and HVPS+/− (235, 230), may be implemented (e.g. one, six, eight, etc.).

The measurement unit 210 may be contained within a single enclosure or within multiple enclosures. In an exemplary embodiment, the controller 220, HVPS+/− (235, 230), low voltage power supplies (not shown), and up to one SMU 240 are contained within a single "master chassis" enclosure, while up to five additional SMUs 240 are contained in an "expansion chassis" coupled to the master chassis.

To measure an I-V curve of a DUT 250 connected to an SMU 240, the controller 220 sets the variable output voltage of the SMU 240 to an initial value and then steps this value progressively up or down to a final value, while recording the current and voltage measured by the SMU 240 at each step. During this process, the controller 200 may also adjust the output voltages of the HVPS+/− supplies (235, 230) so as to minimize internal power dissipation within the SMU 240.

I-V data recorded by the controller 220 may also be uploaded to the computer 200, which may analyze the data and/or store the data in a database.

In one embodiment the computer 200 is external to the measurement unit 210, as depicted in FIG. 2. Alternatively, the computer 200 may be integrated within the measurement unit 210.

In one embodiment, the computer 200 is networked to multiple measurement units 210, and manages and collects data from all associated SMUs 240. In an exemplary embodiment, 48 SMUs 240 are distributed across 8 six-channel measurement units 210 and are managed by a single host computer 200; however, more or fewer measurement units 210 could be employed.

Reference Device

In addition to the SMUs 240 for measuring the DUTs 250, the apparatus may also include one or more specialized measurement channels for measuring a PV reference device (not shown) used to provide a calibrated measure of light intensity. A reference device would typically be comprised of a small crystalline silicon solar cell, but it could also be a full-size PV module, and it could also be a thin-film PV device. Each reference device channel is typically used only to measure the reference device short-circuit current Isc (112), which is proportional to light intensity. Therefore, the reference device measurement circuit does not necessarily need to be connected to HVPS+/− (235, 230), but only to low voltage power supplies, since the reference device voltage will be maintained near zero; However, the reference device measurement circuit is preferably designed with over-voltage protections that safely permit connection of a high-voltage PV reference module. In one embodiment, the short-circuit current 112 is determined by measuring and analyzing small portions of a light I-V curve 110 near zero volts. In another embodiment, the reference device is continuously maintained at its short-circuit current 112 condition (voltage V=0) by using a feedback circuit. Light intensity is determined from the reference device short-circuit current 112 using an appropriate calibration. The controller 220 and/or computer 200 may store the resulting data and/or use it for interpretation and analysis of DUT 250 measurements.

Temperature Measurement

The apparatus may also contain inputs and associated circuitry for external temperature sensors (not shown), such as thermocouples or RTDs (Resistive Thermal Device), to measure the temperature of the DUTs 250 and/or reference device. Since PV device performance is a function of temperature, it is desirable to measure at least one temperature of each DUT 250 and at least one temperature of each reference device. Measured temperatures may be recorded and/or used in data analysis and parameter extraction.

In one embodiment, the apparatus also includes internal temperature sensors (not shown) which measure the temperatures of heat sinks or other critical elements. In this embodiment, the controller could automatically terminate measurements and/or shut down power supplies if internal temperatures were outside of predetermined limits.

High-Voltage Power Supplies

In one embodiment, HVPS+/− (230, 235) are variable output programmable power supplies whose output voltage may be controlled by the controller 220 using either an analog or digital control signal. In one embodiment, the controller 220 may also enable and disable HVPS+/− (235, 230).

HVPS+ 235 provides sufficient voltage and current for the upper limit of dark I-V (current sourcing) measurements. For example, for testing exemplary crystalline silicon PV modules, HVPS+ 235 should provide up to ~15 A at up to ·50 V, while for testing exemplary thin film CdTe PV modules, HVPS+ 235 should provide up to ~3 A at up to ~200 V. Current provisions should be increased if dark I-V measurements are to be performed on multiple DUTs 250 simultaneously.

HVPS− 230 should provide sufficient voltage for the intended lower limit of reverse bias measurements. Typically, about −20V would be sufficient for a variety of PV module types. HVPS− 230 should also provide sufficient current to handle current sinking from all SMUs 240 when their associated DUTs 250 are operated at maximum current. This value depends on the type of PV module and number of SMUs 240 in the system.

Exemplary power supplies for the HVPS+/− (235, 230) requirements include the "Low Profile Switching Regulated Wide Adjust Output" power supplies manufactured by Acopian Technical Company.

In one embodiment, HVPS+ 235 and/or HVPS− 230 may comprise multiple power supplies which are connected in series and/or parallel to provide the desired voltage and/or current.

In another embodiment, HVPS+ 235 and/or HVPS− 230 may comprise multiple power supplies which are connected in series and/or parallel, and the series/parallel configuration of supplies may be modified by operation e.g. of one or more jumpers, switches, or relays, in order to change the current/voltage limits of the combined supply. For example, HVPS+ 235 could be comprised of two 100V/7 A power supplies combined either in series or parallel according to the setting of a jumper, switch, or relay, in order to provide for an output capability of either 200 V at 7 A or 100 V at 14 A. This would provide a single system able to perform dark I-V measurements, for example, on both high-voltage thin-film PV modules and high-current crystalline silicon modules.

In one embodiment, each of the high-voltage power supplies is provided with a bypass diode allowing current to bypass the supply when it is disabled or in the event that the supply provides insufficient current to match the current of another supply with which it is in series.

Source Measurement Unit

Figure 3:
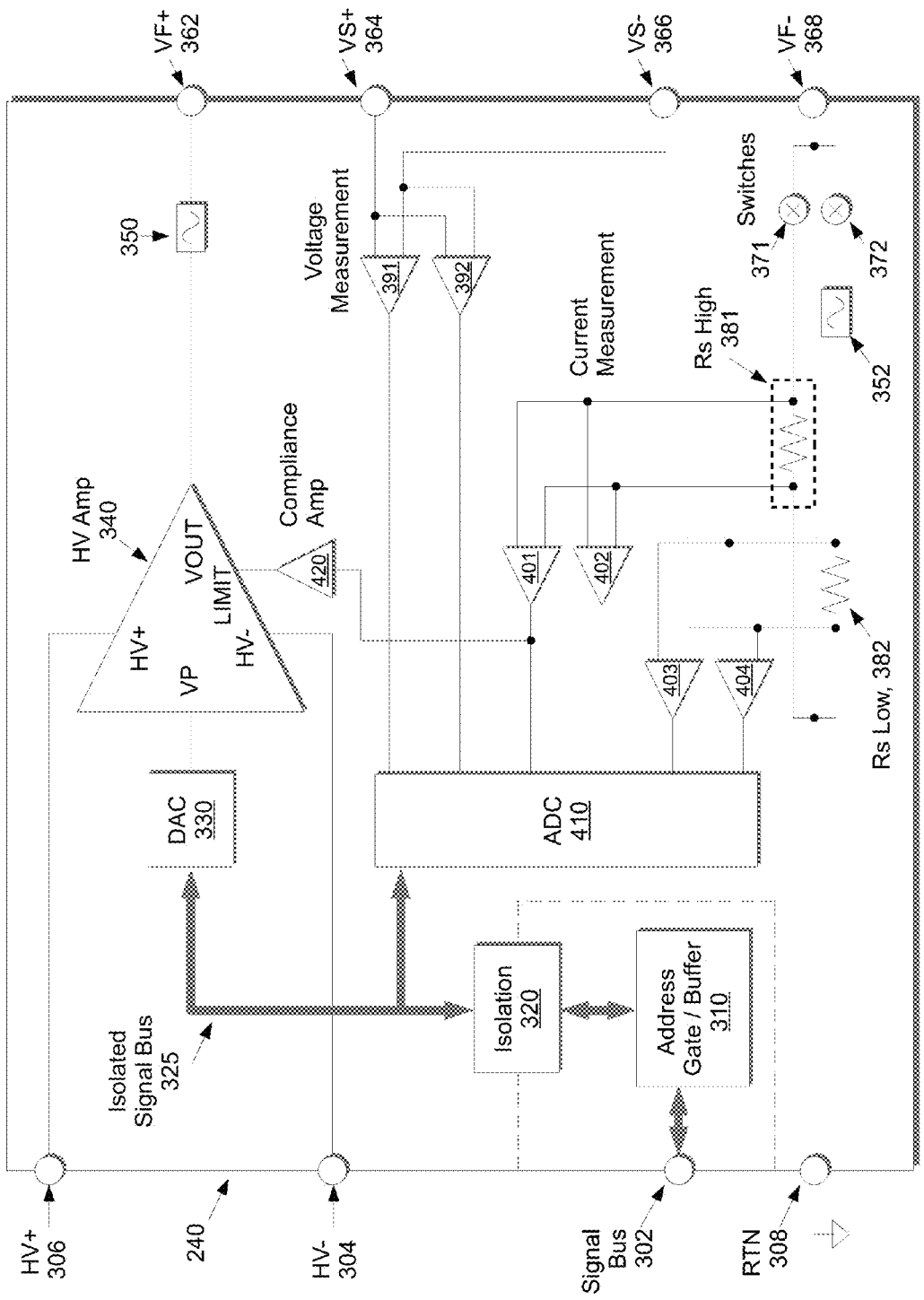
FIG. 3 depicts a block diagram of a source measurement unit portion of an I-V measurement system according to one embodiment of the disclosed subject matter.

FIG. 3 depicts a block diagram of one embodiment of the source measurement unit 240.

Each SMU 240 communicates with the controller 220 via terminals 302 connected to the signal bus 225. Each SMU 240 includes a unique address, and signals from the signal bus 225 pass through an address gate/buffer 310 that passes only signals with a matching address. In an exemplary embodiment, addressing is performed by using individual lines on the signal bus 225 as "SMU select" lines and using a miniature multipole switch (e.g. a DIP switch) to connect the associated SMU select line to a buffer integrated circuit on the SMU 240. More complex schemes may permit a greater number of channels to be addressed.

Signals to/from the signal bus 225 pass through isolation circuitry 320, to protect the signal bus 225 and connected devices (and operators) from potential exposure to hazardous voltages present on the SMU 240. Isolation can be provided, for example, using opto-isolators. In one direction, signals pass through the isolation circuitry 320 along the isolated signal bus 325 to the digital-to-analog converter ("DAC") 330 and/or the analog-to-digital converter ("ADC") 410. In the opposite direction, signals pass from the DAC 330 and/or ADC 410 back through the isolation circuitry 320 to the signal bus 225.

Control circuitry on the SMU 240 is powered by low-voltage power supplies (not shown), which may be connected to multiple SMUs 240 through a power supply bus (not shown).

To generate a desired output voltage from the SMU 240, the DAC 330 is programmed to output a low voltage proportional to the desired output, and this voltage is applied to the VP input of the high-voltage amplifier ("HV Amp") 340. The voltage rails of the high-voltage amplifier 340 are connected to the HV+/− terminals (306, 304) of the SMU 240. The HV Amp 340 outputs a voltage VOUT proportional to the VP input. This is then applied to the VF+ output terminal 362 of the SMU 240, which leads to the positive terminal of the associated DUT 250 (reference FIG. 2). The negative terminal of the DUT 250 is connected to the VF− terminal 368 of the SMU 240, which in turn leads to the current return (floating ground point of the isolated SMUs 240) via the RTN terminal 308 of the SMU 240, completing the current loop. A fuse 350 at the HV Amp 340 output (and/or, in alternative embodiments, on the low-voltage return leg of the circuit) provides circuit protection. Additional current-limiting functions providing circuit protection are discussed below.

The remote voltage at the DUT 250 is measured via the VS+/− terminals (364, 366). One or more voltage measurement amplifiers (391, 392) scale the input voltages to an acceptable level (e.g., using resistive dividers coupled with an instrumentation amplifier). These signals are then digitally encoded using the analog-to-digital converter (ADC) 410. Multiple voltage measurement amplifiers (391, 392) may be used in order to provide optimal measurement sensitivity and resolution in different voltage ranges. For example, the SMU 240 could include a series of voltage measurement amplifiers (391, 392) providing scaled outputs corresponding to full-scale inputs of +/−2 V, +/−20 V, and +/−200 V.

Current through the DUT 250 is measured by placing a current measurement circuit in series with the DUT 250. In one embodiment, as depicted in FIG. 3, the current measurement circuit is placed on the low-voltage current return leg of the SMU 240 connected to the VF− terminal 368; in an alternative embodiment the current measurement could be performed on the high-voltage side connected to the VF+ terminal 362. In one embodiment, current measurement is performed by passing current through a current sensing resistor. The SMU 240 may include multiple current sense resistors (381, 382), which are selected by controllable switches (371, 372). The switches (371, 372) may be implemented, for example, using relays or using semiconductor devices. Multiple current sense resistors (381, 382) may be desired in order to extend the range of currents that may be measured. The voltage drop across each current sense resistor (381, 382) is measured by current sense amplifiers (401, 402, 403, 404) whose outputs are presented to the ADC 410 for digitization. Multiple current sense amplifiers (401, 402, 403, 404) with different gain settings may be used on each current sense resistor (381, 382), in order to provide for optimal sensitivity and resolution in different current ranges. For example, FIG. 3 depicts two current sense amplifiers (401, 402) with different gain settings measuring voltage drops on a low-resistance sense resistor 381 for high currents ("Rs High") and two current sense amplifiers (403, 404) with different gain settings measuring voltage drops on a higher-resistance sense resistor 382 for low currents ("Rs Low").

In an exemplary embodiment, 7 current ranges with full-scale inputs of 4 A, 1 A, 200 mA, 20 mA, 8 mA, 1 mA, and 0.1 mA, respectively, are implemented using a 0.5 ohm current sense resistor with 4 current sense amplifiers and a 250 ohm current sense resistor with 3 current sense amplifiers. The 0.5 ohm current sense resistor is provided with a heat sink for heat dissipation. The exemplary current measurement ranges listed above may be scaled to different ranges by substituting current sense resistors with different values. Although specific ranges and full-scale inputs are provided, alternative ranges could be employed additionally or instead of the foregoing.

Preferably, current sense resistors are implemented using four terminals for accurate measurement of the voltage drop. The current sense resistors are chosen to have low temperature coefficients to maintain measurement precision.

Exemplary four-terminal low-ohm low-temperature coefficient current sense resistors include the USR and UNR series resistors manufactured by Riedon, Incorporated.

For the voltage and current measurements performed by the SMU 240, it is desirable to achieve measurement precisions on the order of less than ~0.1% of the reading plus ~0.025% of the measurement range. Therefore, voltage and current measurement amplifier circuits (391, 392, 401, 402, 403, 404) are implemented using precision resistors with low temperature coefficients and precision instrumentation amplifiers with low offset voltages and low bias currents. Exemplary instrumentation amplifiers include the AD623 and AD8230 manufactured by Analog Devices. A precision low-drift voltage reference (not shown) is also needed for the DAC and ADC.

In one embodiment, all functions of the SMU 240 are controlled by the controller 220 of the measurement unit 210. In an alternative embodiment, the SMU 240 also includes a control element (not shown), such as a microcontroller or field-programmable gate array, which handles low-level functions and communicates with the main controller 220. In one embodiment, the SMU 240 control element is used to execute an I-V measurement sweep and return data to the main controller 220. In another embodiment, the SMU 240 control element is used to perform maximum power point tracking ("MPPT"), which is discussed below.

HV Amplifier

FIG. 4 depicts a circuit diagram of one embodiment of the high-voltage amplifier 340 of the SMU 240. The bi-polar high-voltage amplifier 340 operates between the voltages at its HV+ and HV− nodes (431, 434) and outputs a voltage at VOUT 435 proportional to the voltage at the input VP 432. Current sourcing from HV+ 431 to VOUT 435 is activated by driving the current source output transistors (Q5, Q6, Q7); current sinking from VOUT 435 to HV− 434 (or to RTN 433, via bypass diode D3) is activated by driving the current sink output transistors (Q8, Q9, Q10). The output transistors (Q5, Q6, Q7, Q8, Q9, Q10) may dissipate significant power depending on the voltage difference between VOUT 435 and HV+ 431 or HV−/RTN (434, 433) and are therefore provided with a heat sink HS, depicted by dashed lines in FIG. 4. Control of the output transistors (Q5, Q6, Q7, Q8, Q9, Q10) functions as follows. U1 operates as an inverting amplifier (or, in an alternative embodiment, as a non-inverting amplifier). When the voltage at VOUT 435 differs from the voltage at VP 432 times G, where G is the gain −R20/R1, U1 will cause current to flow in either Q1 or Q2. Q1 or Q2 then provide current ("drive current") to their associated output transistors (Q5, Q6, Q7; or Q8, Q9, Q10), providing output current causing the voltage at VOUT 435 to move towards the desired value. Oscillations are suppressed by feedback compensation elements R8, C1, R9, C2, C3, and C20. Filter capacitors (not shown) connected between HV+ 431 and/or HV− 434 and RTN 433 also reduce oscillations. R2 compensates for input bias in U1 and R3 and limits drive current.

The output transistors (Q5, Q6, Q7, Q8, Q9, Q10) must have high breakdown voltages but also be able to provide sufficient gain. FIG. 4 depicts an embodiment in which the output transistors (Q5, Q6, Q7, Q8, Q9, Q10) are high-gain high-current Darlington bipolar junction (BJT) transistors. Exemplary Darlington transistors include the MJH11021 and MJH11022 devices manufactured by ON Semiconductor. In an alternative embodiment, conventional BJT transistors could be used. In this case, in order to provide sufficient gain, one or more additional transistors may be added prior to the base inputs of the output transistors (Q5, Q6, Q7; or Q8, Q9, Q10) to boost drive current. An exemplary NPN device for the current-sinking side of the circuit (Q8, Q9, Q10) is the MJL4281A transistor manufactured by ON Semiconductor. In another alternative embodiment, MOSFET devices may be used for the source and/or sink output transistors (Q5, Q6, Q7; and/or Q8, Q9, Q10). In this case, the drive current from Q1 and/or Q2 is converted into a voltage by R4 and/or R5, and the resulting voltage enables the MOSFET devices. An exemplary N-channel MOSFET for use on the current-sinking side of the circuit (Q8, Q9, Q10) is the FQH8N100C device manufactured by Fairchild, Inc. The output transistors (Q5, Q6, Q7, Q8, Q9, Q10) will typically include an integrated body diode protecting against reverse-bias, as depicted; alternatively, an external bypass diode may be added.

FIG. 4 depicts three current source output transistors (Q5, Q6, Q7) and three current sink output transistors (Q8, Q9, Q10). However, a greater or lesser number of transistors may be used on either side of the circuit.

When HVPS+/− (235, 230) are both present in the apparatus and connected to SMU 240, the SMU 240 can access all four I-V quadrants (104, 105, 106, 107). However, the high-voltage amplifier 340 design permits the SMU 240 to operate with either or both of HVPS+/− (235, 230) omitted, with a resulting limitation in which I-V quadrants (104, 105, 106, 107) can be accessed. This allows manufacturing the I-V measurement apparatus with configurable options for different applications.

Blocking diodes D1 and D2 prevent current from one SMU 240 from flowing to another parallel-connected SMU 240, so that SMUs can operate independently. When HVPS− 230 is not connected to the HV− terminal 431, bypass diode D3 allows current to flow directly to the floating ground RTN terminal 433.

Current Limit and Safe Operating Area

The output transistors (Q5, Q6, Q7, Q8, Q9, Q10) depicted in FIG. 4 will fail if they are operated beyond their "safe operating area," which is the region of acceptable current as a function of voltage across the device, normally specified by the device manufacturer. Therefore the high-voltage amplifier 340 includes a current limit function to protect the output transistors.

In one embodiment, the current limit function is implemented as a "current foldback," depicted in FIG. 4. On the source side, R10, R11, and R12 in conjunction with Q3 set a maximum current limit for Q5, Q6, and Q7; when this limit is reached the base-emitter voltage drop at Q3 turns on Q3, robbing the drive current to Q5, Q6, Q7. As the voltage difference between HV+ 431 and VOUT 435 increases starting from zero, the current limit initially remains unchanged until D4 begins to conduct; as the voltage difference is increased beyond this breakpoint, current flows through D4 and R6, creating an additional base-emitter voltage drop at Q3, and Q3 turns on at progressively smaller levels of current through R10, R11, R12, resulting in "current foldback" protection which limits power dissipation in Q5, Q6, Q7. The sink side current limit circuit comprised of Q4, R13, R14, R15, R19, R20, R21, R7, and D5 functions in a similar manner.

In an alternative embodiment, the functions of Q3 and/or Q4 are replaced by a comparator or operational amplifier and a precision voltage reference, allowing the current limit to be defined more precisely than possible when relying on the base-emitter specification of Q3 and/or Q4. An additional benefit of this approach is that the voltage drop and accompanying power dissipation in R10, R11, R12, R13, R14, R15 can be reduced.

Figure 5:
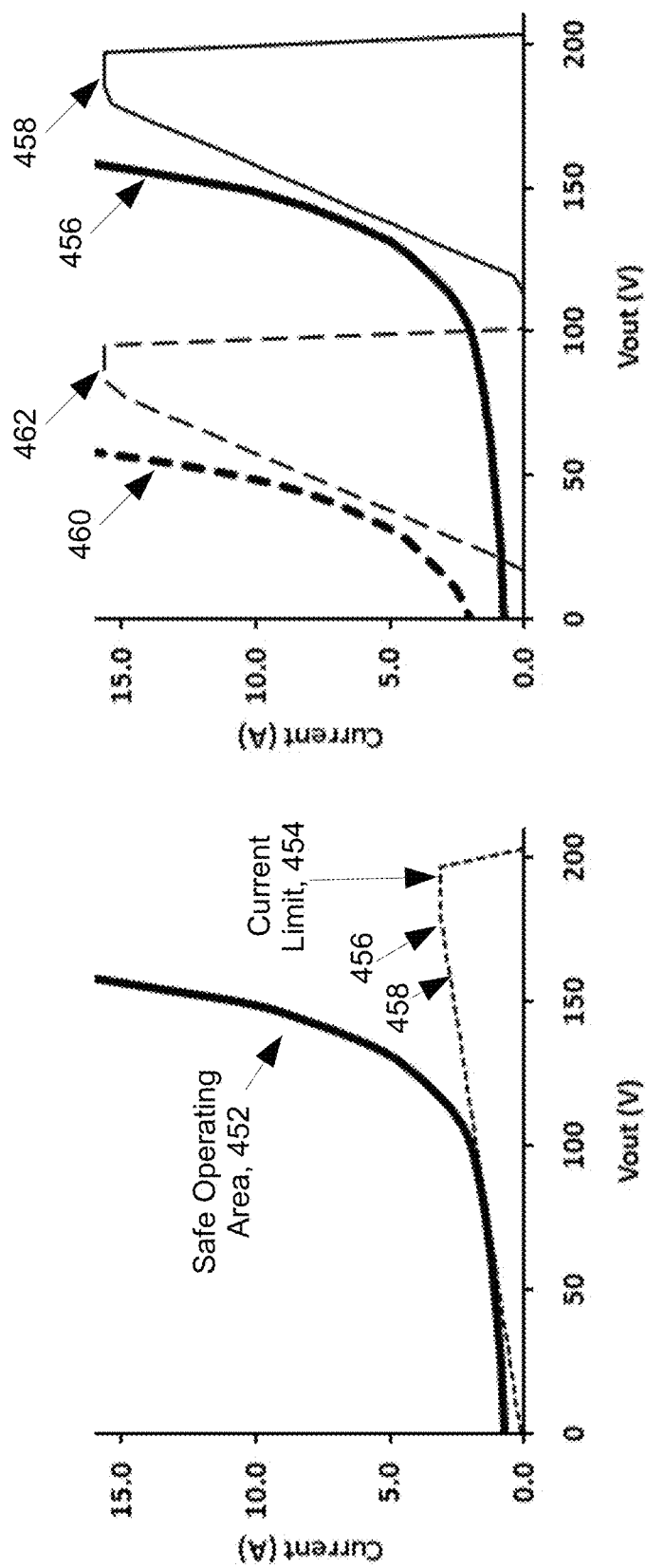
FIG. 5 depicts an exemplary circuit for limiting the output current of the high-voltage amplifier depicted in FIG. 4.

FIG. 5 illustrates the importance of the output transistor safe operating area and current limit in the disclosed subject matter.

The left side of FIG. 5 depicts the safe operating area 452 for an exemplary source circuit using five exemplary MJH11021 PNP Darlington transistors, assuming a voltage at HV+ 431 of 200 V. When VOUT 435 is near 200 V, the voltage drop across the output transistors is small and the devices can permissibly conduct significant current; however, as the VOUT 435 voltage is reduced, the permissible current output represented by the safe operating area curve 452 decreases significantly. It is evident that for maximum current output, the voltage difference between VOUT 435 and HV+ 431 should be minimized.

Curve 454 depicts an exemplary current limit function implemented by the current limit circuit described previously. The maximum current limit is set by R10, R11, R12, the position of breakpoint 456 is set by D4, and the slope of the curve beyond the breakpoint 458 is set by R6. The component values are selected so that the current limit function 454 allows output across the entire voltage range. However, as a consequence, the maximum current limit (at voltages near that of HV+ 431) is considerably below the safe operating area limit curve 452.

The right side of FIG. 5 depicts an alternative approach. Curve 456 is again the safe operating area limit of the five exemplary Darlington transistors. Curve 458 is an exemplary current limit function adjusted to provide a greater current limit for VOUT 435 near the voltage of HV+ 431, with the result that the current limit at lower voltages is now reduced to zero. However, by lowering the HV+ 431 voltage, the safe operating area 456 and current limit curves 458 shift to the left, as depicted by 460 and 462, respectively. Therefore, maximum output current can be achieved across the output voltage range by continuously adjusting the HV+ 431 voltage to a value just above the desired VOUT 435 voltage.

Figure 6:
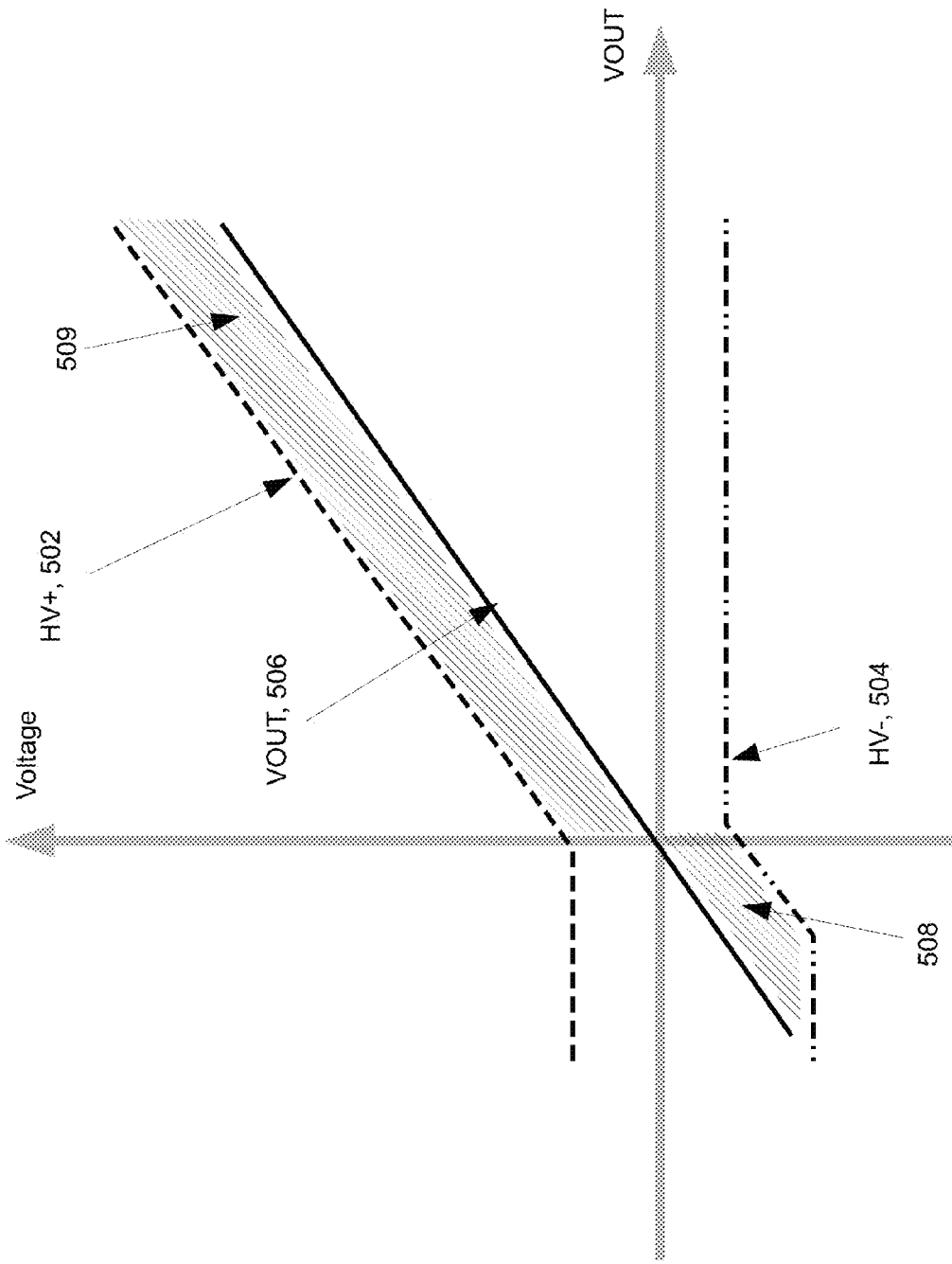
FIG. 6 depicts safe operating areas of transistor devices in the current-sourcing portion of a high voltage amplifier, together with exemplary current limit functions.

Continuous adjustment of the rail voltages according to the output voltage is further illustrated in FIG. 6. The figure depicts an embodiment in which the HVPS+/− (235, 230) supplies are controlled by controller 220 to maintain an exemplary relationship between the HV+ 431 voltage 502, the HV− 434 voltage 504, and the VOUT 435 voltage 506 during a dark I-V measurement. The voltages at HV+ and HV− (502, 504) are adjusted to minimize their differences versus the VOUT voltage 506, minimizing internal power dissipation. Shading (508, 509) depicts the internal voltage drop between the applicable rail voltage node and the VOUT voltage during measurement of a dark I-V curve 120. The HV+ voltage 502 tracks just above the VOUT voltage 506, maintaining the high-voltage amplifier 340 near its maximum current limit (reference FIG. 5).

For operation in the power quadrant 105, internal voltage drops in the high-voltage amplifier 340 are necessarily larger, as illustrated in FIG. 7, since in this case the high-voltage amplifier 340 is sinking power produced by an illuminated DUT 250. FIG. 7 depicts an embodiment in which the HVPS+/− (235, 230) supplies are controlled by controller 220 to maintain an exemplary relationship between the HV+ 431 voltage 512, the HV− 434 voltage 514, and the VOUT 435 voltage 516 during measurement of a light I-V curve 110. Shading 522, 524, and 526 depict the relevant internal voltage drops during operation in quadrants 105, 104, and 107, respectively. The MPP 518 and open-circuit voltage Voc 520 are illustrated in FIG. 7 for reference. Shading 524 illustrates that a significant internal voltage drop exists in the power quadrant 104. This voltage drop, together with the associated current (not illustrated) result in power dissipation in the current sink output transistors (Q8, Q9, Q10). Adjusting the HV− voltage as depicted by curve 514 minimizes the internal power dissipation. In one embodiment, for measurements in the power quadrant 105, the HVPS− 230 supply is disabled, reducing the HV− voltage to 0.

Figure 1:
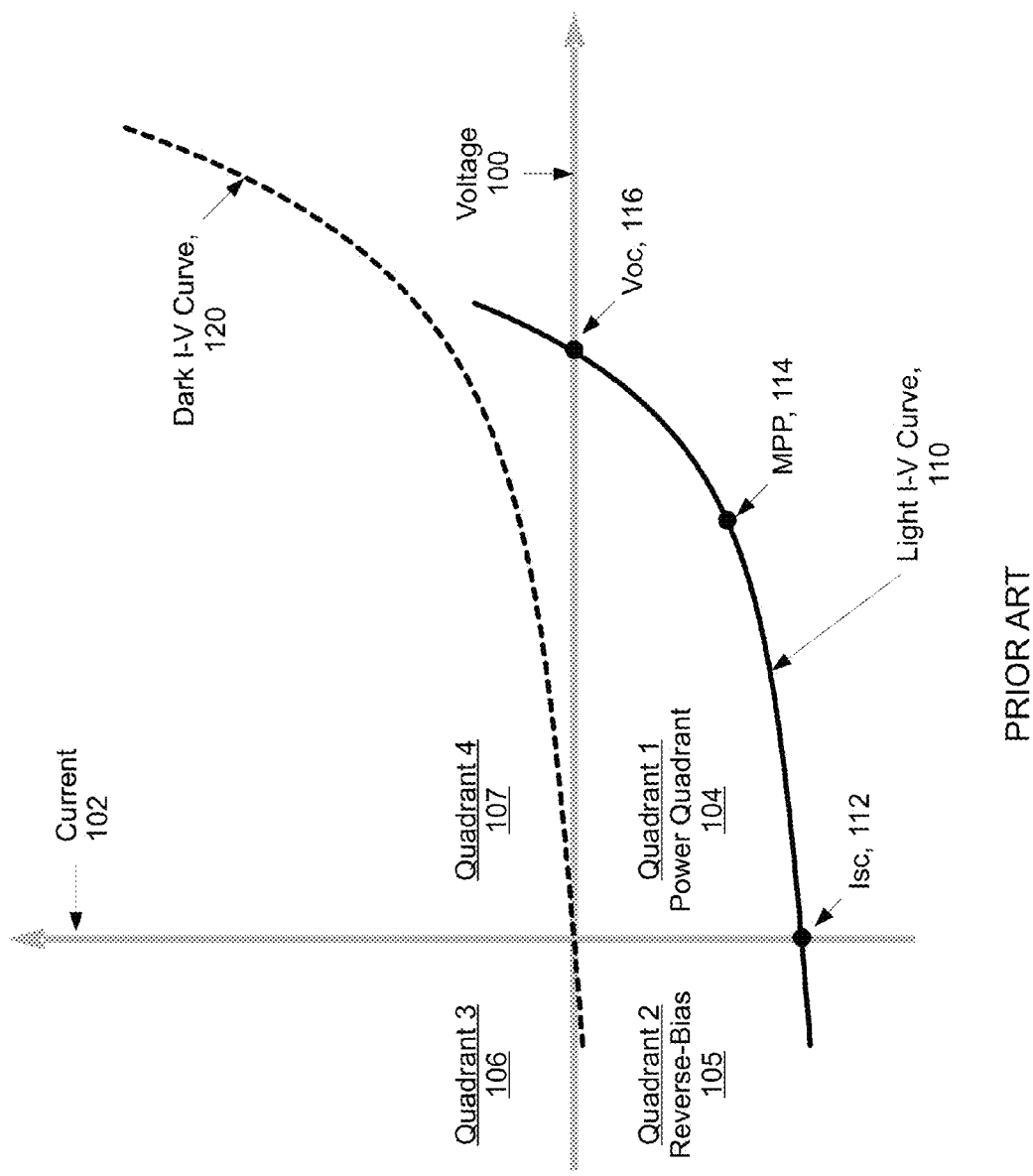
FIG. 1 depicts exemplary light and dark I-V curves of a photovoltaic device.

The safe operating area of the current sink transistors (Q8, Q9, Q10) limits the permissible current and voltage ranges when operating in the power quadrant 105. FIG. 8 depicts the safe operating area 552 of an exemplary current sink circuit comprised of 5 exemplary n-channel high-power high-voltage MOSFET transistor devices in parallel. Curves 558 depict representative light I-V curves 110 (using the opposite current polarity definition as compared to FIG. 1) for a range of exemplary PV modules, including crystalline silicon and thin-film modules.

It is evident that to provide for the measurement of many representative PV module types within a single apparatus, it may be preferable to design the high-voltage amplifier 340 to make optimal use of the safe operating area curve 552. Therefore, in one embodiment, rather than using a current limit function with a single breakpoint such as depicted in FIG. 5 (curves 354, 362, 358), a current limit function as depicted in FIG. 8 in curve 554 is used, wherein the function contains multiple breakpoints e.g. 556 and 557 in order to more closely follow the safe operating area curve 552. This allows testing a large number of PV module types with varying voltage and current ranges but power generally below a specified value. This approach is more cost effective than a design with a rectangular current versus voltage output characteristic (any current at any voltage, within specified ranges), which, to cover a larger number of PV modules, would require overdesigning the apparatus.

A current limit function with multiple breakpoints may be implemented, in one embodiment, as depicted in FIG. 9, which depicts a modification to the circuit of FIG. 4, joined at reference node B. D30 and R31 form a voltage source (terminated, e.g., at the node including the emitter of Q4) which turns on Q30 and Q30', whose maximum collector currents are limited by the values of R30, R30', and D30. D5 and D5' determine the position of the first and second breakpoints (556, 557), respectively, and R7 and R7' determine the slope of the current limit curve 554 following the first and second breakpoints (556, 557), respectively. It will be apparent that circuit elements may be repeated to provide an arbitrary number of breakpoints in the current limit curve 554.

In one embodiment, multiple breakpoints in the current limit curve 554 are selected to make optimal use of the safe operating area 552. In another embodiment, multiple breakpoints are selected in order to make the current limit curve 554 approximate a curve of constant power dissipation, within the safe operating area 552.

Note that multiple breakpoints could be implemented in the current source foldback circuit as well, in a similar manner to that depicted in FIG. 9, using complementary transistor types, etc., with similar benefits. In one embodiment, multiple breakpoints are used in the source side current limit circuit so that, in contrast to the depiction on the right side of FIG. 5, the current limit function 458 makes optimal use of the safe operating area 456, and the circuit can provide both a high output current at low internal voltage drops as well as at least some current at all output voltages. This helps eliminate an undesirable "latch" condition in which the high-voltage amplifier 340 ceases to operate if output current is momentarily forced to zero.

Current Compliance

An additional current limit function may also be added in order to provide a precise fixed or programmable current compliance. This may be used, for example, to protect the DUTs 250 by specifying a maximum current value for a test, or to protect an operator by temporarily reducing compliance to 0, disabling the output.

One embodiment of the current compliance function is depicted schematically in FIG. 3. A compliance amplifier 420 compares the reading of a current measurement amplifier 401 with a compliance reference voltage (not shown) and outputs a limit signal when the current measured by the current measurement amplifier 401 exceeds the compliance reference. The compliance reference may be fixed or may be generated by a digital to analog converter (not shown), allowing a programmable setting. In one embodiment, the input of the compliance amplifier 420 includes an absolute value function such that the compliance is independent of current polarity. The limit signal output of the compliance amplifier 420 is provided to the LIMIT input of the high-voltage amplifier 340, reducing the current output. Feedback thus maintains the maximum current at the value determined by the fixed or programmable compliance reference voltage.

FIG. 10 depicts one embodiment of the LIMIT input to the high-voltage amplifier 340. The figure depicts a modification to the circuit of FIG. 4, joined at reference node A. When the voltage at the LIMIT input is increased sufficiently above zero, Q11 and Q13 are turned on, robbing current from the output of U1. This removes base current from Q1 or Q2, reducing drive current to the output transistors (Q5, Q6, Q7, Q8, Q9, Q10).

In the embodiment depicted in FIG. 3, the compliance function is only present when switch 371 selects sense resistor Rs High 381, i.e. when the apparatus is used in its high current ranges. In an alternative embodiment, an additional compliance amplifier (not shown), takes input from current measurement amplifier 403 from the low current ranges and compares this with another fixed or programmable current compliance reference (not shown), and the output of said additional compliance amplifier is summed with the output of compliance amplifier 420, the summed output being provided to the LIMIT input of the high-voltage amplifier 340. In another alternative embodiment, the sense resistors Rs High 381 and Rs Low 382 are rearranged so that they are in series, and a bypass switch (not shown), which may comprise a relay or semiconductor devices, is placed in parallel with Rs Low 382 such that current will bypass Rs Low 382 when the bypass switch is closed. Measurement in the high current ranges is accomplished by opening the bypass switch, and measurement in the low current ranges is accomplished by closing the bypass switch. In this embodiment, current always flows in Rs High 381, and compliance amplifier 420 always has an input signal. Alternative embodiments connecting Rs High 381 and/or Rs Low 382 in different configurations may be used to accomplish the same objective.

The compliance function may be used to protect the internal sense resistor Rs Low 382 for the low current ranges, reducing reliance on fuse 352. For measurement of the dark I-V curve 120, the test voltage may reach high levels while the current is still small, requiring use of the low current ranges which include a high sense resistance Rs Low 382 intended for measuring the low currents. However, if the currents suddenly increase (for example, due to a failure or short-circuit of the DUT 250), the power dissipation at Rs Low 382 could be exceeded, and protection is therefore needed. Preferably, fuse 352 is only a backup protection, and alternate circuitry is used to avoid frequent fuse 352 replacements. In one embodiment, programmable current compliance is used to protect Rs Low 382 when the low current scales are engaged. In another embodiment, an additional fixed current compliance function referencing the current measurement amplifier 403 from the low current range is added (in a manner similar to that discussed above), providing built-in protection of Rs Low 382 without relying on software control.

Auto-Ranging

The SMU 240 is provided with multiple voltage and current measurement ranges (represented in FIG. 3 by the voltage and current measurement amplifiers (391, 392, 401, 402, 403, 404)) in order to obtain optimal measurement sensitivity and resolution over wide limits of current and voltage. In order to make optimal use of multiple measurement ranges, it is advantageous for the measurement system to include features for automatic selection of the best range ("auto-ranging").

In one embodiment, auto-ranging of voltage measurement ranges is implemented as follows. The controller 220 initially reads the voltage on any of the measurement ranges. If the reading is above/below a pre-determined percentage of full scale (e.g. 90%/10%), the controller 220 advances to the next higher/lower range, repeating this sequence until the optimal range is found. The measurement is then performed and recorded. For the next data acquisition, the measurement is initially performed at the previously used range. However, if the reading is above or below the pre-determined thresholds, the controller advances to the next scale up or down and repeats the measurement, until the optimal range is selected.

In one embodiment, auto-ranging of current measurement ranges is performed in a similar manner, with some modifications. Upon initiation of an I-V measurement sequence, and preferably before enabling the HVPS+/− (235, 230) supplies, the controller 220 selects the high current sense resistor Rs High 381 (via the switches (371, 372)) and the highest current measurement amplifier 401. Readings are then performed and progressively lower current measurement ranges are selected as needed. Beginning with the highest current measurement range helps to protect the measurement circuit against over-current situations which could damage the low current sense resistor Rs Low 382. Rs Low 382 is only engaged when the current is verified to be in an acceptably low range. The low current sense resistor Rs Low 382 may also be further protected using current compliance functions as discussed previously.

Switches

In one embodiment, current range selection switches (371, 372) are implemented using mechanical relays. For example, the functions of both switches (371, 372) may be combined using a single-pole-dual-throw (SPDT) relay. However, readily available low-cost miniature PCB relays typically are not rated to withstand interrupting significant DC current at voltages exceeding tens of volts, due to the potential for arcing which progressively degrades relay contacts and presents safety problems. Therefore, in one embodiment, software control is used to ensure that the current range selection switches (371, 372), implemented using mechanical relays, are never switched at currents and voltages outside their rated interrupt limits. In an alternative embodiment, the switches (371, 372) are implemented using semiconductor devices rated to withstand the full range of voltages and currents to be used by the SMU 240.

Calibration

The voltage and current measurement amplifier circuits (391, 392, 401, 402, 403, 404) of each SMU 240 must be calibrated against a reference meter. In one embodiment, a specialized test fixture is used together with a calibration software feature to provide semi-automatic calibration. The test fixture includes a cable which connects to the output terminals of the SMU 240; another cable which connects to the terminals of the reference meter, which is also interfaced to the system computer running the calibration software; internal resistors of various resistance values; and switches or relays which can be used to select one of the resistors to be placed in series with a current loop from the SMU 240 through the reference meter and back. For calibration of the current measurement ranges, the calibration software selects an appropriate resistance for each range, varies the output voltage of the SMU 240 in several steps, reads the measured current from both the SMU 240 and the reference meter at each step, and determines calibration factors from comparison of the readings. For calibration of the voltage measurement ranges, the procedure is similar but the calibration software selects no resistor, so that the SMU 240 is in an open circuit condition. Calibration data may be stored within the SMU 240 (e.g. in non-volatile memory, not shown), within the controller 220, or within the computer 200. Automated calibration capabilities are particularly advantageous when the I-V system includes many output channel SMUs 240.

Current Offset Calibration

Accurate measurement of small currents requires precise calibration of the low range current measurement amplifiers (403, 404) to compensate for any offset voltages in the amplifiers. However, these offsets may drift over time. In one embodiment, the apparatus automatically compensates for this drift by measuring the output of the low range current measurement amplifiers (403, 404) during intervals when their sense resistor Rs Low 382 is not engaged, i.e. when current in this circuit is known to be zero.

Maximum-Power Point Tracking

In one embodiment, a system according to the disclosed subject matter is used to provide a continuous load to the DUTs 250 for extended periods. This may be done, for example, when the DUTs 250 are exposed to continuous illumination, either in a continuous solar simulator or in natural sunlight. For continuous loading it may be desirable to maintain a DUT 250 near its MPP 114. The MPP 114 voltage is a function of illumination, temperature, and other conditions, which may include the DUT 250 history. Therefore, maintaining the DUT 250 at its MPP may require continuous tracking A system according to the disclosed subject matter may include a maximum power point tracking ("MPPT") mode. In one embodiment, MPPT is achieved by measuring an I-V curve 110 of each associated DUT 250 or an abbreviated region of the full I-V curve 110 with a low but optimal point density, calculating the MPP 114 voltage from the measured data, setting the SMU 240 for the associated DUT 250 to the MPP 114 voltage, and then iteratively repeating these steps.

In one embodiment, the MPPT sequence is controlled by the system controller 220 for all SMUs 240. In an alternative embodiment, the MPPT sequence is controlled by a dedicated control element on each SMU 240, not shown.

In one embodiment, a system according to the disclosed subject matter may alternate between states of continuous loading (e.g. with MPPT) and I-V curve measurement, including both light and/or dark I-V curves (110, 120). This may be advantageous for measuring the I-V curves of DUTs 250 at regular intervals during periods of extended operation at load.

Independence of SMUs

In one embodiment, the SMUs 240 operate substantially independently, such that each DUT 250 associated with each SMU 240 may operate at a different current or voltage at any one instant, within constraints resulting from the fact that the HV+ 306 and HV− 304 terminals of the SMUs are electrically connected.

Supression of Power Line Cycle Noise

In one embodiment, the measurement unit 210 also contains a circuit for detecting the AC mains power line cycle, and data acquisition and averaging are synchronized to the power line cycle, in order to reduce the effects of any electrical noise sources that may be synchronous with the power line cycle. This feature may be implemented, for example, by programming the controller 220 to initiate and conclude data acquisition and averaging at transitions of the power line cycle.

Data Analysis and Parameter Extraction

In one embodiment, an I-V measurement system according to the disclosed subject matter includes analysis software to extract device parameters of the DUTs 250 from the measured light and/or dark I-V curves (110, 120). These parameters may include, but are not limited to, short-circuit current (Isc), open-circuit voltage (Voc), MPP voltage and current, maximum power, efficiency, fill factor, shunt resistance, series resistance, diode saturation current, and diode ideality factors.

Software Implementation

In one embodiment, system software includes one portion which is embedded into firmware of the controller 220, and another portion which runs on host computer 200. Computer 200 and controller 220 are connected via any of a number of standard communication links, such as USB (Universal Serial Bus) or Ethernet. Functions of the controller 220 firmware software include, but are not limited to: enabling/disabling the power supplies; executing an I-V measurement sequence; auto-ranging; power supply ramping; data acquisition and averaging; temperature monitoring and shutoff for circuit protection; and calibration. Functions of the host computer 200 software include, but are not limited to, setting up and storing measurement configurations; initiating measurement sequences; displaying data; analyzing data, including extracting device parameters; storing measured data and/or extracted device parameters; providing a database of measurement results; and calibration.

Computing System

An exemplary computer 200 for implementing the disclosed subject matter includes a general purpose computing device in the form of a computing system, commercially available from a variety of manufacturers. Components of the computing system may include, but are not limited to, a processing unit, a system memory, and a system bus that couples various system components. The computing system typically includes a variety of computer readable media, including both volatile and nonvolatile media, and removable and non-removable media. Computer memory includes, but is not limited to, RAM, ROM, EEPROM, flash memory or other memory technology, CD-ROM, digital versatile disks (DVD) or other optical disk storage, magnetic disks, or any other medium which can be used to store the desired information and which can be accessed by the computing system. A user may enter commands and information into the computing system through input devices such as a keyboard, a mouse, or other interfaces. A monitor or other type of display device may also be connected to the system bus via an interface. The monitor may also be integrated with a touch-screen panel or the like. The computing system may be a conventional personal computer or a programmable logic controller (PLC) or other miniaturized device for industrial use. The computing system may operate in a networked environment using logical connections to one or more remote computers. The remote computing system may be a personal computer, a server, a router, a network PC, a peer device or other common network node, and typically includes many or all of the elements described above relative to the computing system.

Exemplary Embodiment

FIG. 11 and FIG. 12 depict exemplary embodiments of the disclosed subject matter based on a prototype system.

FIG. 11 depicts an exemplary embodiment of the SMU 240 implemented on a single printed circuit board ("PCB") assembly 602. Ten output transistors 604 are mounted on a common heat sink 606 (cross-reference Q5-Q10 and HS in FIG. 4). A high current range sense resistor 608 (equivalent to Rs High, 381) is mounted on a dedicated heat sink 610.

FIG. 12 depicts exemplary chassis for the measurement unit 210. A master chassis 620 contains one SMU PCB assembly 602, cooling fans 622 to direct air over the heat sinks (606, 610) of the SMU assembly 602, power supplies, a controller 220 PCB assembly, terminals for connection of the DUTs 250, and other elements. An expansion chassis 630 contains five additional SMU assemblies 602, and additional cooling fans 622. The master chassis 620 and expansion chassis 630 can be mated together 640 and electrically interconnected with cables, not shown.

PV Cells

Although discussed in the context of performing I-V measurements of PV modules, it should be understood that the disclosed subject matter also applies to the measurement of PV cells.

Conclusion

Although example diagrams to implement the elements of the disclosed subject matter have been provided, one skilled in the art, using this disclosure, could develop additional hardware and/or software to practice the disclosed subject matter and each is intended to be included herein.

In addition to the above described embodiments, those skilled in the art will appreciate that this disclosure has application in a variety of arts and situations and this disclosure is intended to include the same.

What is claimed is:

1. An apparatus for measuring current versus voltage ("I-V") of photovoltaic ("PV") modules, comprising:
    at least two source measurement units ("SMUs"), each of which is associated with one PV module device under test ("DUT"); and
    a controller which controls functions of said at least two SMUs, each of said at least two SMUs further comprising:
        an output terminal electrically connected to one terminal of said associated DUT and a return terminal electrically connected to a second terminal of said associated DUT;
        a high-voltage amplifier which provides an output voltage to said output terminal of said SMU, wherein said high-voltage amplifier:
            sources current from a positive supply terminal of said SMU via said output terminal of said SMU to said DUT; and/or
            sinks current from said DUT via said output terminal of said SMU to a negative supply terminal of said SMU;
        one or more voltage measurement circuits measuring the remote voltage at the DUT associated with said SMU; and
        one or more current measurement circuits measuring the current flowing between said SMU and said associated DUT via said output terminal and said return terminal; and
    wherein each said positive supply terminal of said at least two SMUs are electrically connected, and each said negative supply terminal of said at least two SMUs are electrically connected;
    wherein said high-voltage amplifier comprises:
        a program input;
        an operational amplifier;
        a pair of transistors for producing a drive current, said drive current consisting of: a positive drive current, or a negative drive current;
        at least one of: said positive supply terminal, and said negative supply terminal;
        an output terminal;
        output transistors which when enabled by said drive current performs:
            at least one of:
                sources current from said positive supply terminal to said output terminal; and
                sinks current from said output terminal to said negative supply terminal;
            and a current limit function which protects said output transistors;
    wherein said operational amplifier compares said program input with a voltage at said output terminal scaled by a gain factor and produces an error signal which drives said pair of transistors for producing said drive current; and
    wherein said current limit function limits output current from said output transistors by providing an alternate path for said drive current when said output current exceeds a threshold value, and wherein said threshold value is reduced as a voltage difference across said output transistors is increased.

2. The apparatus of claim 1, further comprising a high-voltage power supply coupled to said at least two SMUs via at least one of: said positive supply terminal, and said negative supply terminal.

3. The apparatus of claim 2, wherein said controller selectively disables the output voltage of said high-voltage power supply during I-V measurement to minimize internal power dissipation in said high-voltage amplifier.

4. The apparatus of claim 2, wherein said high-voltage power supply has programmable output voltages, and wherein said controller adjusts said programmable output voltages during I-V measurement to minimize internal power dissipation in said high-voltage amplifier.

5. The apparatus of claim 2, wherein I-V data are measured in two or more I-V quadrants.

6. The apparatus of claim 2, wherein the apparatus measures a dark I-V curve of one or more of said DUTs.

7. The apparatus of claim 2, wherein at least one of said high-voltage power supply comprises multiple power supplies connected in series and/or parallel, and the series/parallel configuration of said power supplies is modified by operation of one or more jumpers, switches, relays, or semiconductor devices in order to change the current/voltage limits of said high-voltage power supplies formed by the combination of said multiple power supplies.

8. The apparatus of claim 1, wherein each said negative supply terminal of said at least two SMUs are electrically connected to a floating ground return point via at least one bypass diode.

9. The apparatus of claim 1, wherein said high-voltage amplifier operates at a fixed output voltage or current, wherein said fixed output voltage or current is programmed by said controller.

10. The apparatus of claim 1, wherein the apparatus measures a light I-V curve of one or more of said DUTs.

11. The apparatus of claim 1, wherein the apparatus maintains one or more of said DUTs at a fixed point along an I-V curve for an indefinite period, sourcing or sinking power to/from said DUT as required to maintain said fixed point.

12. The apparatus of claim 11, wherein said fixed point is one of a specified voltage, a specified current, the short-circuit current of said DUT, the open-circuit voltage of said DUT, or the maximum power point of said DUT.

13. The apparatus of claim 12, wherein said fixed point is maintained by repeatedly following the steps of:
measuring a portion of said I-V curve of said DUT between predetermined limits;
identifying said fixed point within said portion of said I-V curve;
setting each of said at least two SMUs corresponding to said DUT to the voltage or current value corresponding to said fixed point; and
waiting for a predetermined time.

14. The apparatus of claim 1, wherein the voltages provided by said at least two SMUs is 100 V or greater.

15. The apparatus of claim 1, wherein the currents provided by said at least two SMUs is 10 A or greater.

16. The apparatus of claim 1, wherein each of said one or more current measurement circuits comprise at least two current sense resistors used to measure current in different ranges, wherein said current sense resistors are selectively placed in series with said associated DUT using at least one switch, relay, or semiconductor device.

17. The apparatus of claim 16, wherein said controller actuates said switch, relay, or semiconductor device for selecting said current sense resistors only when the current and voltage at said switch, relay, or semiconductor device are within acceptable limits.

18. The apparatus of claim 16, wherein a measurement offset of at least one of said one or more current measurement circuits is automatically calibrated when said at least one of one or more current measurement circuits is deselected by said switch, relay, or semiconductor device, such that the current in said at least one of one or more current measurement circuits is known to be zero.

19. The apparatus of claim 1, wherein each of said at least two SMUs comprises a control element which communicates with said controller and controls functions of a SMU associated with said control element, wherein said control element executes an I-V measurement sequence, performs maximum power point tracking, and/or maintains another fixed point along an I-V curve and wherein said control element is a microcontroller or field-programmable gate array.

20. The apparatus of claim 1, wherein said output transistors are either bipolar junction transistors ("BJT"), Darlington BJT transistors, MOSFET transistors, or insulated gate bipolar transistors ("IGBT").

21. The apparatus of claim 1, wherein said high-voltage amplifier further comprises a bypass diode which allows current to flow from said output transistor to a floating ground return point when no negative power supply is connected to said negative supply terminal.

22. The apparatus of claim 1, wherein said high-voltage amplifier further comprises one or more blocking diodes in series with at least one of: said positive supply terminal, and said negative supply terminal.

23. The apparatus of claim 1, wherein said current limit function comprises at least one sense resistor, a voltage reference, and a gain element, wherein the gain element provides an alternate path for said drive current when the voltage drop across said sense resistor exceeds said voltage reference.

24. The apparatus of claim 23, wherein said voltage reference is a precision voltage reference and wherein said gain element is a comparator or operational amplifier.

25. The apparatus of claim 1, wherein said current limit function reduces said output current as a function of voltage drop across said output transistors in a stepwise linear fashion including two or more breakpoints.

26. The apparatus of claim 25, wherein the current allowed by said current limit function optimally uses the safe operating area of said output transistors or approximates a curve of constant power dissipation.

27. The apparatus of claim 1, wherein each of said at least two SMUs further comprise a precise fixed or programmable current compliance function which limits the output current from said high-voltage amplifier, wherein said current compliance function comprises a compliance amplifier which compares an output of at least one of said of one or more current measurement circuits to at least one precise fixed or programmable reference value and provides a limit signal to said high-voltage amplifier when said reference value is exceeded.

28. The apparatus of claim 27, wherein said current compliance function automatically limits output current to a value that protects at least one of said of one or more current measurement circuits when said at least one of one or more current measurement circuit is engaged.

29. The apparatus of claim 1, wherein said controller progressively engages said of one or more current measurement circuit, beginning with a higher current range and proceeding to lower current ranges, in order to verify that actual current is within acceptable limits for said lower current ranges.

30. The apparatus of claim 1, further comprising a circuit for detecting an AC mains power line cycle of the apparatus, and wherein an output signal of said circuit is used as a trigger signal to initiate and/or conclude data acquisition from one or more of said at least two SMUs, such that said data acquisition occurs substantially synchronously with said power line cycle in order to suppress noise substantially synchronous with said power line cycle.

31. The apparatus of claim 1, further comprising a master chassis and an expansion chassis, wherein said controller is contained within said master chassis and one or more of said at least two SMUs are contained within said expansion chassis, and wherein said master chassis and said expansion chassis are connected.

32. The apparatus of claim 1, wherein said controller includes non-volatile memory which is used to store program information and/or calibration information.

33. The apparatus of claim 1, further comprising a computer which communicates with said controller, provides a user interface, initiates measurements and/or records results, analyzes resulting data to determine measured parameters, stores calibration and/or configuration data, and/or stores resulting data.

34. The apparatus of claim 33, further comprising multiple controllers, wherein each of said multiple controllers controls one or more of said at least two SMUs, wherein said computer performs at least one of:
communicating with said multiple controllers; and
managing and collecting data from said at least two SMUs.

* * * * *